(12) United States Patent
Azeroual et al.

(10) Patent No.: US 11,088,123 B1
(45) Date of Patent: Aug. 10, 2021

(54) PACKAGE SYSTEM HAVING LATERALLY OFFSET AND OVELAPPING CHIP PACKAGES

(71) Applicant: Marvell Israel (M.I.S.L) Ltd., Yokneam (IL)

(72) Inventors: Dan Azeroual, Kiriat Ata (IL); Ronen Sinai, Yokneam (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 16/412,978

(22) Filed: May 15, 2019

Related U.S. Application Data

(60) Provisional application No. 62/671,894, filed on May 15, 2018.

(51) Int. Cl.
| | |
|---|---|
| *H01L 23/495* | (2006.01) |
| *H01L 23/48* | (2006.01) |
| *H01L 23/52* | (2006.01) |
| *H01L 29/40* | (2006.01) |
| *H01L 25/10* | (2006.01) |
| *H01L 23/498* | (2006.01) |
| *H01L 25/00* | (2006.01) |
| *H01L 23/32* | (2006.01) |
| *H01R 12/85* | (2011.01) |

(52) U.S. Cl.
CPC ............ *H01L 25/105* (2013.01); *H01L 23/32* (2013.01); *H01L 23/49811* (2013.01); *H01L 23/49822* (2013.01); *H01L 23/49838* (2013.01); *H01L 25/50* (2013.01); *H01R 12/85* (2013.01); *H01L 2225/107* (2013.01); *H01L 2225/1023* (2013.01); *H01L 2225/1041* (2013.01)

(58) Field of Classification Search
CPC .............. H01L 23/32; H01L 23/49811; H01L 23/49822; H01L 23/49838; H01L 25/50; H01L 25/117; H01L 25/041; H01L 25/065; H01L 25/07; H01L 23/49833; H01L 25/043; H01L 25/0657; H01L 25/074; H01L 25/0756
USPC ........................................ 257/668, 786, 773
See application file for complete search history.

(56) References Cited

U.S. PATENT DOCUMENTS

| | | | |
|---|---|---|---|
| 9,368,450 B1 * | 6/2016 | Gu ...................... H01L 25/0655 |
| 2013/0183872 A1 * | 7/2013 | Florence, Jr. .......... H01R 12/52 439/817 |
| 2017/0278830 A1 * | 9/2017 | Kim ........................ H01L 25/50 |

* cited by examiner

*Primary Examiner* — Duy T Nguyen
*Assistant Examiner* — Dilinh P Nguyen

(57) ABSTRACT

Aspects of the disclosure provide a package system that includes a first integrated circuit (IC) package and a second IC package. The first IC package includes a first IC chip mounted on a first substrate-chip surface of a first package substrate. The first package substrate includes first near-conductive layers that are closer to the first substrate-chip surface than first far-conductive layers. The second IC package includes a second IC chip mounted on a second substrate-chip surface of a second package substrate. The second package substrate includes second near-conductive layers that are closer to the second substrate-chip surface than second far-conductive layers. A first contact structure on the first substrate-chip surface and a second contact structure on the second substrate-chip surface electrically couple the first IC chip with the second IC chip through electrical connections in the first and second near-conductive layers.

26 Claims, 6 Drawing Sheets

PACKAGE SYSTEM HAVING LATERALLY OFFSET AND OVELAPPING CHIP PACKAGES

INCORPORATION BY REFERENCE

This present disclosure claims the benefit of U.S. Provisional Application No. 62/671,894, "Face to Face Package Interposer" filed on May 15, 2018, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In electronic manufacturing, integrated circuit (IC) packaging is a step in the semiconductor device fabrication that encapsulates a semiconductor die (also referred to as an IC chip) of integrated circuits in a supporting case that prevents physical damage, corrosion and the like. The supporting case with the encapsulated semiconductor die is referred to as an IC package. The IC package also provides a larger surface for electrical contacts to connect the semiconductor die in the IC package to, for example, a printed circuit board (PCB). In some examples, multiple IC packages that are mounted on a PCB are interconnected, for example by copper wires on the PCB. The available bandwidth for transferring signals between the multiple IC packages is limited by the current technologies, such as the PCB based interconnection technology.

SUMMARY

Aspects of the disclosure provide a package system that includes a first integrated circuit (IC) package and a second IC package. The first IC package has a first package substrate and a first IC chip that is mounted on a first substrate-chip surface of the first package substrate. The first package substrate includes first near-conductive layers that are closer to the first substrate-chip surface of the first package substrate than first far-conductive layers in the first package substrate. The second IC package has a second package substrate and a second IC chip that is mounted on a second substrate-chip surface of the second package substrate. The second package substrate includes second near-conductive layers that are closer to the second substrate-chip surface of the second package substrate than second far-conductive layers in the second package substrate. At least a first contact structure that is formed on the first substrate-chip surface of the first package substrate and a second contact structure that is formed on the second substrate-chip surface of the second package substrate are configured to electrically couple the first IC chip with the second IC chip through electrical connections formed in the first near-conductive layers and the second near-conductive layers.

Aspects of the disclosure provide a method for interconnecting a first integrated circuit (IC) package and a second IC package. The method includes mounting the first IC package to a printed circuit board (PCB). The first IC package has a first package substrate and a first IC chip that is mounted on a first substrate-chip surface of the first package substrate. The first package substrate includes first near-conductive layers that are closer to the first substrate-chip surface of the first package substrate than first far-conductive layers in the first package substrate. Further, the method includes disposing and aligning a second IC package with regard to the first IC package. The second IC package has a second package substrate and a second IC chip that is mounted on a second substrate-chip surface of the second package substrate. The second package substrate includes second near-conductive layers that are closer to the second substrate-chip surface of the second package substrate than second far-conductive layers in the second package substrate. Then the method includes electrically coupling at least a first contact structure that is formed on the first substrate-chip surface of the first package substrate with a second contact structure that is formed on the second substrate-chip surface of the second package substrate to electrically couple the first IC chip with the second IC chip through electrical connections formed in the first near-conductive layers and the second near-conductive layers.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
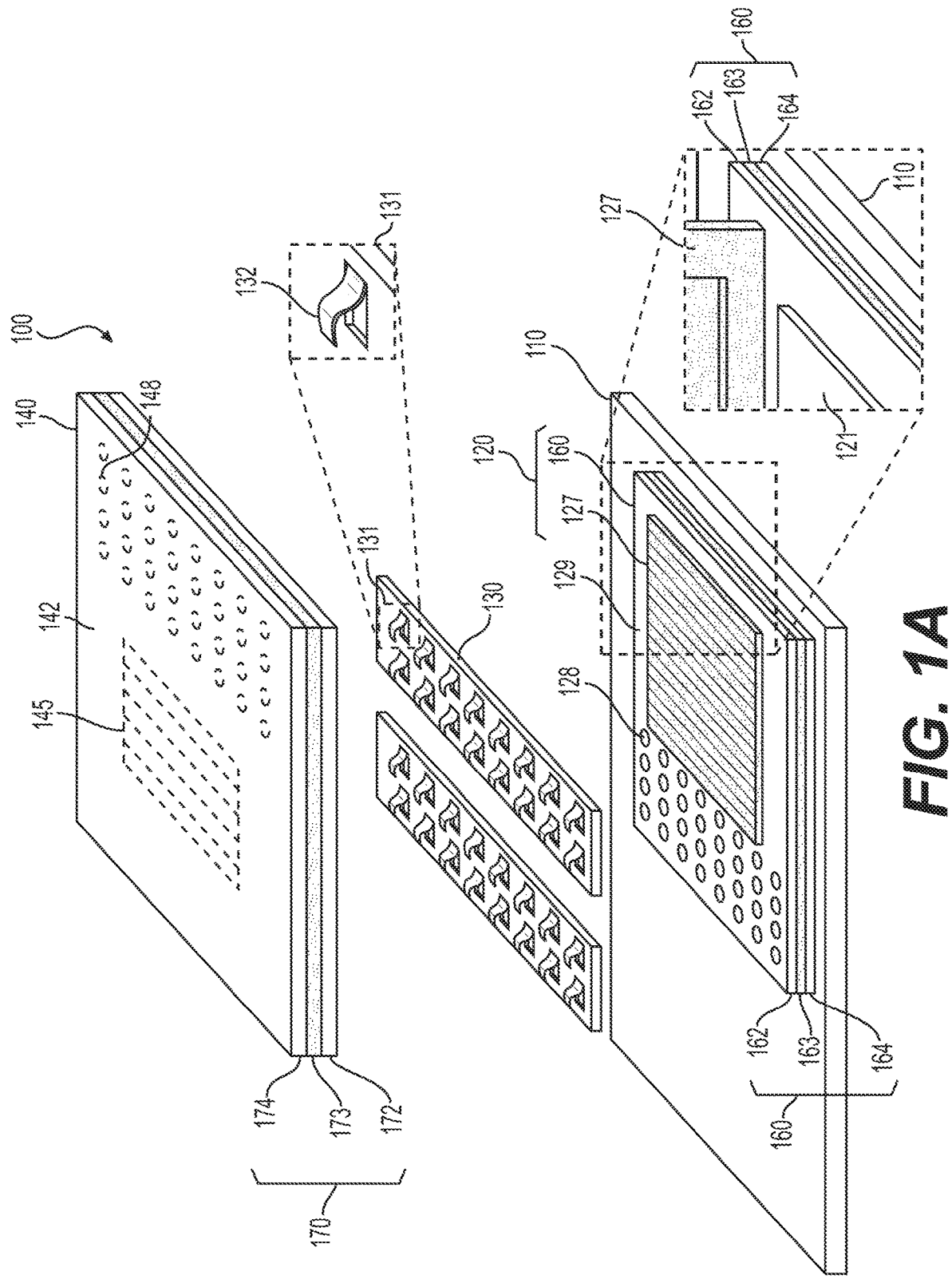
FIGS. 1A-1C show a printed circuit board (PCB) system 100 with integrated circuit (IC) packages 120 and 140 according to embodiments of the disclosure.

Aspects of the disclosure provide a package system that includes a first integrated circuit (IC) package and a second IC package. The first IC package and the second IC package are similarly configured to include contact structures on the same surface where an IC chip is mounted. Specifically, the first IC package includes a first package substrate and a first IC chip that is mounted on a specific surface of the first package substrate, and includes a first array of contact structures formed on the specific surface, for example, at a peripheral area of the IC package adjacent to at least one edge of the IC chip. The specific surface of the first package substrate is referred to as a first substrate-chip surface. Similarly, the second IC package includes a second package substrate and a second IC chip that is mounted on a second substrate-chip surface of the second package substrate, and includes a second array of contact structures formed on the second substrate-chip surface, for example, at a peripheral area.

In some implementation examples, the first package substrate and the second package substrate are formed in the manner of a build-up structure. For example, a package substrate is formed from a core substrate, and then patterned conductive layers (e.g., copper wires) and non-conductive sheet layers are alternatively built up on both sides of the core substrate at the same time. Generally, the core substrate is relatively thick to provide mechanical stability. Further, to make electrical connections to the patterned conductive layers on the opposite sides of the core substrate, plated through hole (PTH) vias are formed in the core substrate. The PTH vias generally introduce relatively large parasitic inductance and capacitance in wire connections and impair certain circuit performance attributes, such as data rate, frequency response, and the like. The patterned conductive layers on the same side of the core substrate can be electrically coupled through laser vias that have relatively small parasitic inductance and capacitance. In the present disclosure, the patterned conductive layers on the same side of the core substrate as the IC chip are referred to as near-side conductive layers, and the patterned conductive layers on the opposite side of the core substrate from the IC chip are referred to as far-side conductive layers. In conventional package configurations, far-side conductive layers are utilized to connect a package substrate to a printed circuit board, while the near-side conductive layers provide suitable I/O couplings for the IC to the package substrate.

According to some aspects of the disclosure, the first IC package and the second IC package are disposed with the first substrate-chip surface facing the second substrate-chip surface. The first array of contact structures are aligned with the second array of contact structures and are electrically coupled with the second array of contact structures to transmit electrical signals between the first IC chip and the second IC chip. By the disposing the first and second IC substrate-chip surfaces to electrically interconnect by facing each other, the signal transmission between the first IC chip and the second IC chip can be conducted in the near-side conductive layers without using the PTH vias in some examples. For example, at least a first contact structure in the first array of contact structures is connected to a first input/output (I/O) structure on the first IC chip using the near-side conductive layers of the first package substrate without passing through or otherwise using any plated through hole vias; and at least a second contact structure in the second array of contact structures is connected to a second I/O structure on the second IC chip using the near-side conductive layers of the second package substrate without passing through or otherwise using any plated through hole vias. Thus, the signal transmission between the first I/O structure on the first IC chip and the second IC chip is not impaired by any PTH vias in the first package substrate and/or the second package substrate.

In some embodiments, the first and second IC packages are a part of a printed circuit board (PCB) system, and one of the first and second IC packages, such as the first IC package is mounted on a PCB.

Figure 1B:
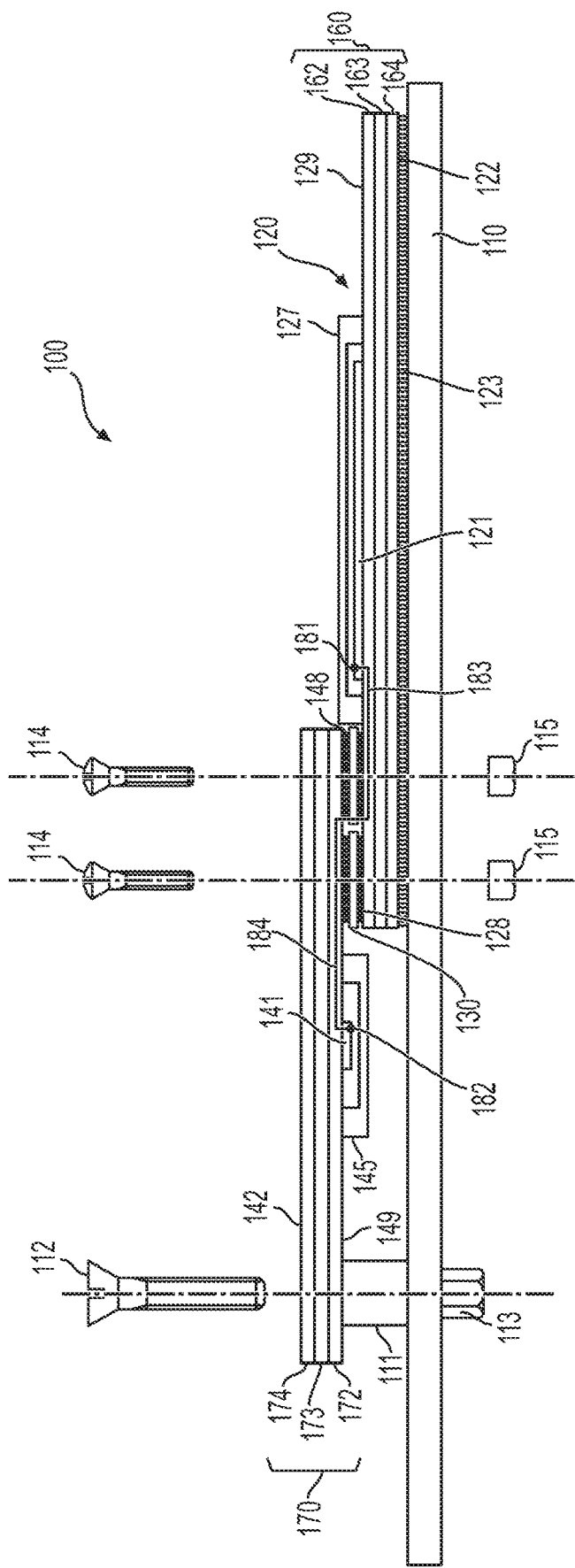
Figure 1C:
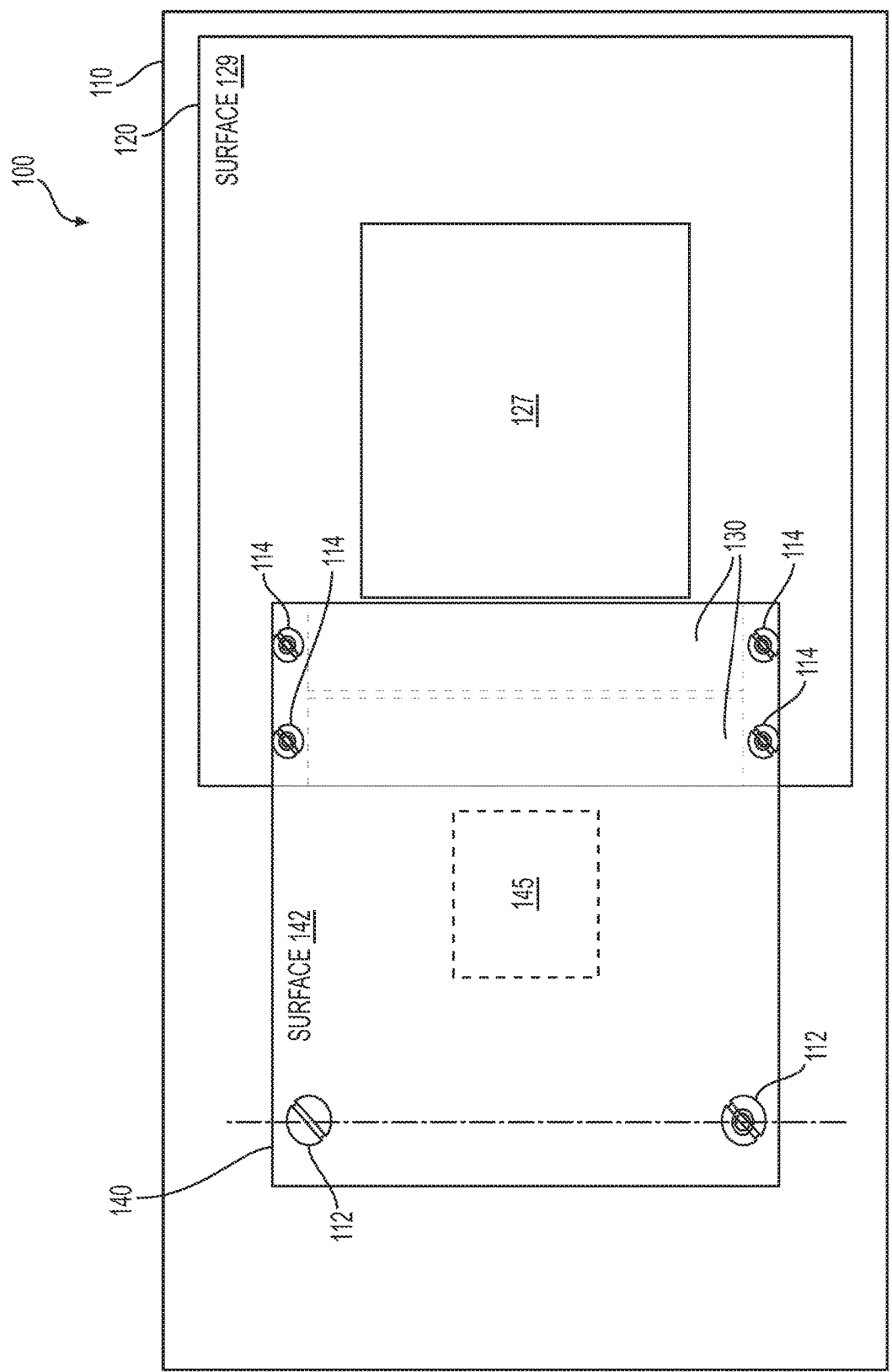

FIGS. 1A-1C show different views of a PCB system 100 according to some embodiments of the disclosure. FIG. 1A shows a perspective view of the PCB system 100, FIG. 1B shows a cross-sectional view of the PCB system 100, and FIG. 1C shows a top view of PCB system 100. The PCB system 100 seen in FIGS. 1A-1C includes a PCB 110, a first IC package 120 and a second IC package 140 coupled together. The first IC package 120 encapsulates one or more IC chips, such as a first IC chip 121. The second IC package 140 encapsulates one or more IC chips, such as a second IC chip 141 (seen on FIG. 1B). The first IC chip 121 and the second IC chip 141 are electrically coupled together. At least a first I/O structure 181 (seen on FIG. 1B) of the first IC chip 121 is electrically coupled with a second I/O structure 182 (seen on the FIG. 1B) of the second IC chip 141 using the near-side conductive layers shown as conductive traces 183 and 184, without use of traces or electrical connections pass through a plated through hole via.

Specifically, the first IC package 120 includes a package substrate 160 that has a first surface 129 and a second surface 122 that is opposite to the first surface 129. The package substrate 160 is relatively rigid to provide mechanical support to the first IC chip 121. The first IC chip 121 is disposed on the first surface 129, thus the first surface 129 is referred to as the substrate-chip surface 129. Further, in some examples, the first IC package 120 includes a metal cover 127 that covers the first IC chip 121, for example to protect the first IC chip 121 and to aid in rapid heat dissipation during operation when the first IC chip 121 is powered on, in an embodiment. FIG. 1A shows a close up view when the metal cover 127 is lifted up from one side, and the first IC chip 121 is exposed.

The package substrate 160 also provides electrical support for the first IC chip 121, such as electrical connections for the first IC chip 121 to facilitate coupling of the first IC chip 121 to a PCB (e.g., PCB 110) or another IC package, such as the second IC package 140.

The package substrate 160 includes a core substrate 163, a first build-up portion 162 and a second build-up portion 164. The first build-up portion 162 and the second build-up portion 164 are built-up respectively on opposite sides of the core substrate 163. Generally, the core substrate 163 is formed of a comparatively thick isolating material (also referred to as dielectric material) that is relatively rigid to provide mechanical support. The first build-up portion 162 includes patterned conductive layers, such as patterned metal traces (e.g., copper wires), that are laminated between non-conductive sheet layers. Similarly, the second build-up portion 164 includes patterned conductive layers, such as patterned metal traces (e.g., copper wires), that are laminated between non-conductive sheet layers.

Further, the patterned conductive layers in the first build-up portion 162 are closer to the first IC chip 121 than the patterned conductive layers in the second build-up portion 164, thus the patterned conductive layers in the first build-up portion 162 is referred to as near-side conductive layers, and the patterned conductive layers in the second build-up portion 164 are referred to as far-side conductive layers.

The metal traces on the different layers are connected by conductive vias, such as laser vias and/or PTH vias, in various embodiments. The PTH vias are formed in the core substrate 163 to connect the patterned conductive layers on opposite sides of the core substrate 163. When two metal traces are disposed respectively in two patterned conductive layers of the first build-up portion 162 only, the two metal traces can be connected by laser vias without passing through any PTH vias. Similarly, when two metal traces are disposed respectively in two patterned conductive layers of the second build-up portion 164 only, the two metal traces can be connected by laser vias without passing through any PTH vias. However, when two metal traces are respectively disposed in two patterned conductive layers on opposite sides of the core substrate 163, then one or more PTH vias are used with or without laser vias to connect the two metal traces.

The detail structures of a package substrate will be described with reference to FIG. 2.

According to aspects of the disclosure, the package substrate 160 provides interconnects from the inputs/outputs of the first IC chip 121 to the contact structures that are formed on the first surface 129 and the second surface 122 of the IC package 120. In an example, the first IC chip 121 is a flip chip. The first IC chip 121 includes input/output (I/O) pads (not shown) that are electrically connected to internal circuits that are formed on the first IC chip 121. Then, solder bumps are deposited on the I/O pads by suitable manufacturing process to form bump-out structures on the surface of the flip chip, for example during a packaging process to form the IC package 120. The first surface 129 of the package substrate 160 includes solder bump pads (not shown) that match the bump-out structures on the first IC chip 121. In an example, the first IC chip 121 is disposed on the first surface 129, such that the bump-out structures on the first IC chip 121 are aligned with the solder bump pads on the first surface 129 of the package substrate 160. Then, a reflow process during a process for packaging the first IC package 120 is performed to form connections of the bump-out structures and the solder bump pads.

It is noted that, in another example, the first IC chip 121 can be wire-bonded to form electrical connections with the package substrate 160.

In the example shown in FIGS. 1A-1C, the package substrate 160 includes first contact structures 128 formed on the first surface 129 and second contact structures 123 (seen on FIG. 1B) formed on the second surface 122. Further, the package substrate 160 includes metal traces that electrically connect the solder bumps to the first contact structures 128 and the second contact structures 123.

According to an aspect of the disclosure, the first contact structures 128 and the first IC chip 121 are disposed on the same surface side, such as the first surface (also referred to as the substrate-chip surface) 129, of the package substrate 160. In some embodiments, the first contact structures 128 are disposed at a peripheral area that is adjacent to at least one side of first IC chip 121, such as the area between the metal cover 127 for the first IC chip 121 and an edge of the first surface 129. In some configurations, not shown, the first contact structures 128 are disposed to at least partially surround the first IC chip 121.

The first contact structures 128 and the second contact structures 123 can be any suitable contact structures. In an embodiment, the first IC package 120 is a ball grid array (BGA) package, and each of the first and second contact structures 128 and 123 includes a solder pad and a solder ball that is deposited on the solder pad. In another embodiment, the first IC package 120 is a land grid array (LGA) package, and each of the first and second contact structures 128 and 123 includes a solder pad. In another embodiment, the first IC package 120 is a pin grid array (PGA) package, and each of the first and second contact structures 128 and 123 includes a pin.

It is noted that, in some embodiments, the second contact structures 123 are implemented using a different technology from the first contact structures 128. For example, the first contact structures 128 are implemented using solder pads, and the second contact structures 127 are implemented using solder pads and solder balls.

In the example of FIG. 1A, the first contact structures 128 are shown as circles. In some examples, the first and second contact structures 128 and 123 have other suitable shapes, such as a sphere, a square, a pin shape, and the like.

According to an aspect of the disclosure, the first contact structures 128 and the second contact structures 123 are respectively configured to enable electrical connections to other components using suitable techniques. In an example, the second contact structures 123 are configured to enable electrical connections to the PCB 110 using soldering techniques. For example, when the first IC package 120 is mounted on the PCB 110, a solder reflow process is performed to final solder joints (also referred to as solder contacts), thus the second contact structures 123 are connected to corresponding contact structures on the PCB 110.

Similarly, the second IC package 140 includes a package substrate 170 that has a first surface 149 (seen in FIG. 1B) and a second surface 142 that is opposite to the first surface 149. The package substrate 170 is relatively rigid to provide mechanical support to the second IC chip 141. The second IC chip 141 is disposed on the first surface 149, thus the first surface 149 is referred to as the substrate-chip surface 149. Further, in some examples, the second IC package 140 includes a metal cover 145 (seen in FIG. 1B) that covers the second IC chip 141, for example to protect the second IC chip 141 and to aid in rapid heat dissipation during operation when the second IC chip 141 is powered on, in an embodiment.

The package substrate 170 also provides electrical support for the second IC chip 141, such as electrical connections for the second IC chip 141 to facilitate coupling of the second IC chip 141 to another IC package, such as the first IC package 120.

The package substrate 170 includes a core substrate 173, a first build-up portion 172 and a second build-up portion 174. The first build-up portion 172 and the second build-up portion 174 are built-up respectively on opposite sides of the core substrate 173. Generally, the core substrate 173 is formed of a comparatively thick isolating material (also referred to as dielectric material) that is relatively rigid to provide mechanical support. The first build-up portion 172 includes patterned conductive layers, such as patterned metal traces (e.g., copper wires), that are laminated between non-conductive sheet layers. Similarly, the second build-up portion 174 includes patterned conductive layers, such as patterned metal traces (e.g., copper wires), that are laminated between non-conductive sheet layers.

Further, the patterned conductive layers in the first build-up portion 172 are closer to the second IC chip 141 than the patterned conductive layers in the second build-up portion 174, thus the patterned conductive layers in the first build-up portion 172 is referred to as near-side conductive layers, and the patterned conductive layers in the second build-up portion 174 are referred to as far-side conductive layers.

The metal traces on the different layers are connected by conductive vias, such as laser vias and/or plated through hole (PTH) vias, in various embodiments. The PTH vias are formed in the core substrate 173 to connect the patterned conductive layers on opposite sides of the core substrate 173. When two metal traces are disposed respectively in two patterned conductive layers of the first build-up portion 172 only, the two metal traces can be connected by laser vias without passing through any PTH vias. Similarly, when two metal traces are disposed respectively in two conductive layers of the second build-up portion 174 only, the two conductive layers can be connected by laser vias without passing through any PTH vias. However, when two metal traces are respectively disposed in two patterned conductive layers on opposite sides of the core substrate 173, then one or more PTH vias are used with or without laser vias to connect the two patterned conductive layers.

The detail structures of a package substrate will be described with reference to FIG. 2.

According to aspects of the disclosure, the package substrate 170 provides interconnects from the inputs/outputs of the second IC chip 141 to the contact structures that are formed on the first surface 149 and the second surface 142 of the IC package 140. In an example, the second IC chip 141 is a flip chip. The second IC chip 141 includes input/output (I/O) pads (not shown) that are electrically connected to internal circuits that are formed on the second IC chip 141. Then, solder bumps are deposited on the I/O pads by suitable manufacturing process to form bump-out structures on the surface of the flip chip, for example during a packaging process to form the IC package 140. The first surface 149 of the package substrate 170 includes solder bump pads (not shown) that match the bump-out structures on the second IC chip 141. In an example, the second IC chip 141 is disposed on the first surface 149, such that the bump-out structures on the second IC chip 141 are aligned with the solder bump pads on the first surface 149 of the package substrate 170. Then, a reflow process during a process for packaging the second IC package 140 is performed to form connections of the bump-out structures and the solder bump pads.

It is noted that, in another example, the second IC chip 141 can be wire-bonded to form electrical connections with the package substrate 170.

In the example shown in FIGS. 1A-1C, the package substrate 170 includes contact structures 148 formed on the first surface 149. Further, the package substrate 170 includes metal traces that electrically connect the solder bumps to the contact structures 148.

According to an aspect of the disclosure, the contact structures 148 and the second IC chip 141 are disposed on the same surface side, such as the first surface (also referred to as the substrate-chip surface) 149, of the package substrate 170. In some embodiments, the contact structures 148 are disposed at a peripheral area that is adjacent to at least one side of the second IC chip 141, such as the area between the metal cover 145 for the second IC chip 141 and an edge of the first surface 149. In some configurations, not shown, the contact structures 148 are disposed to at least partially surround the second IC chip 141.

The contact structures 148 can be any suitable contact structures. In an embodiment, the second IC package 140 is a ball grid array (BGA) package, and each of the contact structures 148 includes a solder pad and a solder ball that is deposited on the solder pad. In another embodiment, the second IC package 140 is a land grid array (LGA) package, and each of the contact structures 148 includes a solder pad. In another embodiment, the second IC package 140 is a pin grid array (PGA) package, and each of the contact structures 148 includes a pin.

It is noted that, while in the FIG. 1A-1C example, no contact structures are shown on the second surface 142 of the second IC package 142, contact structures can be formed on the second surface 142 in some other examples. In some embodiments, contact structures formed on the second surface 142 are used for top connections, for example, connections that are similarly to those described in Applicant's co-pending application Ser. No. 16/050,113 filed on Jul. 31, 2018, which is incorporated herein by reference in its entirety.

In the example of FIG. 1A, the contact structures 148 are shown as circles. In some examples, the contact structures 148 have other suitable shapes, such as a sphere, a square, a pin shape, and the like.

The contact structures 148 are configured to enable electrical connections to other component, such as the first IC package using suitable techniques. In an embodiment, the contact structures 148 are configured to enable electrical connections to the first IC package 120 via the interposer 130.

The interposer 130 includes a plurality of interconnection structures 131 to interconnect the corresponding contact structures 148 of the second IC package 140 and the first contact structures 128 of the first IC package 120, in an embodiment. Each interconnection structure 131 is configured to make a first connection with a contact structure 128 and a second connection with a contact structure 148 using suitable techniques. In an embodiment, each interconnection structure 131 is a dual compression structure that uses compression connection for the first connection and the second connection. In another embodiment, each interconnection structure 131 is a single compression structure with a solder ball that uses the solder ball for the first connection and compression connection for the second connection.

FIG. 1A includes a close up view of one side of an interconnection structure 131 that is configured for compression connection. The interconnection structure 131 includes a metal tongue 132 that protrudes the surface of the interposer 130, and the metal tongue 132 can be pushed into the surface under a compression force.

In an embodiment, the PCB system 100 includes a force generation component that can apply a compression force to cause the interposer 130 to interconnect the contact structures 148 with the first contact structures 128. For example, the PCB 110, the first IC package 120 and the second IC package 140 are designed and fabricated with holes that can be suitably aligned for fastening by bolts. After the first IC package 120 is mounted on the first PCB 110, the interposer 130 and the second IC package 140 are stacked and aligned. It is noted that suitable spacers 111 can be inserted to level the second IC package 140 on the PCB 110. Then bolts 112 and 114 are fastened to corresponding nuts 113 and 115 to lock the PCB 110, the interposer 130, the first IC package 120 and the second IC package 140 in place, and to apply compression force to cause the interposer 130 to interconnect the contact structures 148 of the second IC package 140 with the first contact structures 128 of the first IC package 120.

According to an aspect of the disclosure, the interposer 130 has a high density and low profile. In an example, the interposer 130 has a pitch grid of 0.80 mm (e.g., smaller than solder ball pitch), and a body height of 1 mm (0.33 mm height for shortest signal path). In an embodiment, the pitch grid of the interposer 130 is smaller than solder ball pitch requirement. In an example, the density of the first contact structures 128 is higher than the density of the second contact structures 123. The first IC package 120 uses both sides of the package substrate to provide inputs/outputs (IOs), and can be implemented with a reduced package size.

In another embodiment, the electrical connections from the first contact structures 128 of the first IC package 120 to, for example the second IC package 140, are through the interposer 130 that provides a relatively shorter signal path compared to other interconnection techniques, such as package plated through hole (PTH) via, PCB PTH, PCB, and the like. Thus the electrical connections from the first contact structures 128 to the second IC package 140 via the interposer 130 have less attenuation than the other interconnection techniques, and thus can be used for high speed signal transmission, such as (but not limited to) over 50 Gbps data rate.

In another embodiment, a power supply is provided from the PCB 110 to the second IC package 140 via the first IC package 120 (e.g., via one of the second contact structures 123, some metal traces in the packet substrate 122, some laser vias, a PTH via, and one of the first contact structures 128), and the interposer 130.

It is noted that the first IC chip 121 and the second IC chip 141 can be any suitable integrated circuit chips, such as an integrated circuit processor, controller, transceiver, switching device, system on chip and the like that can be electrically coupled to perform certain functions. In some embodiments, one of the first IC chip 121 and the second IC chip 141 includes a core circuit for packet processing, and the other includes peripheral circuits for interface (input/output) processing, such as receiving and/or transmitting signals carrying packets.

Figure 2:
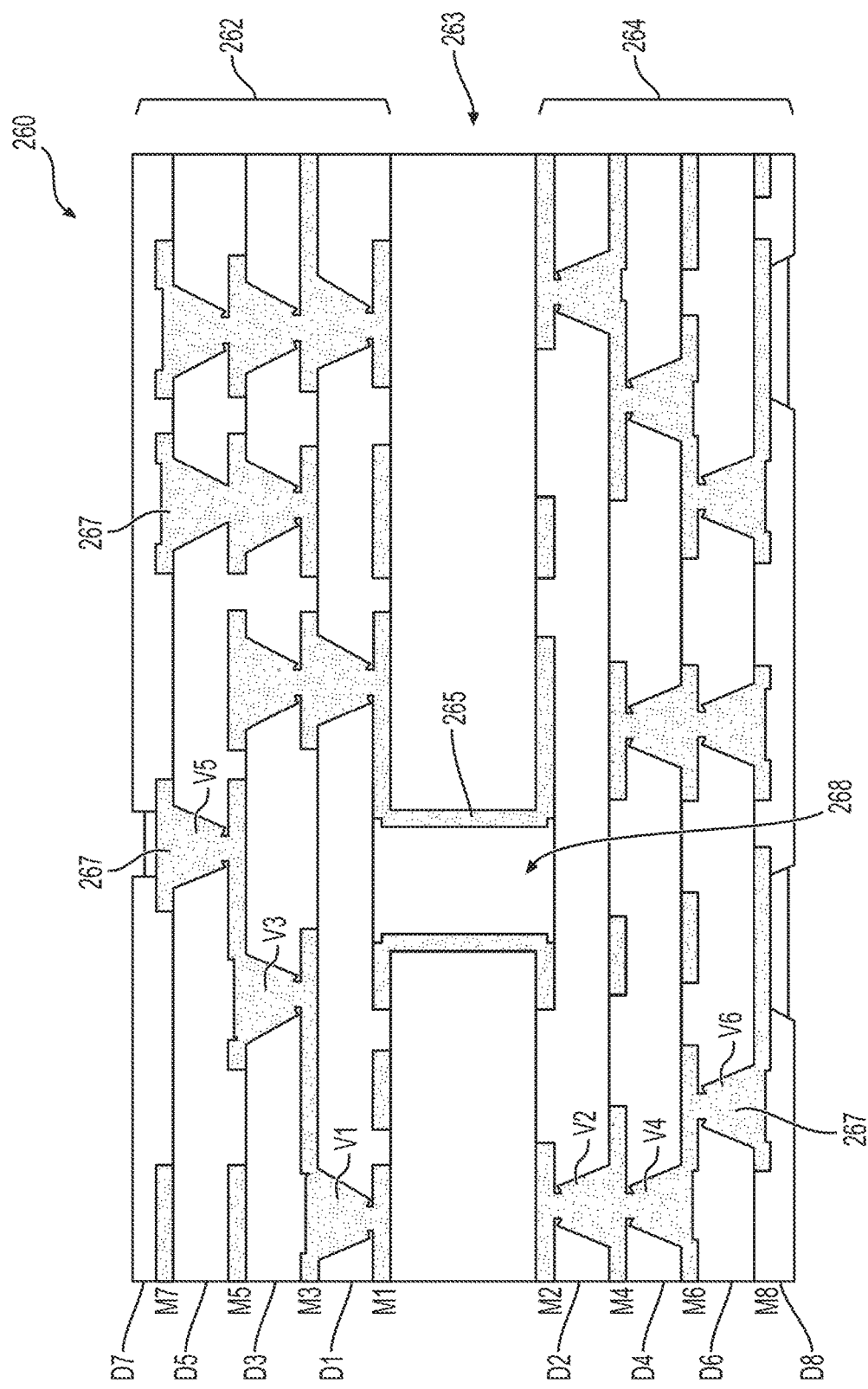
FIG. 2 shows a cross-sectional view of a package substrate that is used in the IC packages 120 and 140 in the PCB system 100 according to embodiments of the disclosure.

FIG. 2 shows a cross sectional view of a package substrate 260 that is used in the PCB system 100 according to embodiments of the disclosure. In an example, the first package substrate 160 and the second package substrate 170 are similarly configured as the package substrate 260.

The package substrate 260 includes a core substrate 263, a first build-up portion 262 and a second build-up portion 264. The first build-up portion 262 and the second build-up portion 264 are built-up respectively on opposite sides of the core substrate 263.

Generally, the core substrate 263 is formed of a comparatively thick isolating material (also referred to as dielectric material) that is relatively rigid to provide mechanical stability. In some examples, through holes 268 are formed by mechanical drilling. Then, then the through holes 268 are plated with metal 265 to form plated through hole vias 268.

The first build-up portion 262 includes patterned conductive layers, such as patterned metal layers M1, M3, M5 and M7, that are laminated between non-conductive sheet layers D1, D3, D5 and D7. Similarly, the second build-up portion 264 includes patterned conductive layers, such as patterned metal layers M2, M4, M6 and M8, that are laminated between non-conductive sheet layers D2, D4, D6 and D8.

In an example, to form the first build-up portion 262 and the second build-up portion 264, the patterned metal layers M1 and M2 are formed (e.g., laminated and patterned) respectively on the opposite sides of the core substrate 263. Then, the non-conductive sheet layers D1 and D2 are formed respectively on the patterned metal layers M1 and M2. Laser vias V1 are formed in the non-conductive sheet layer D1 and laser vias V2 are formed in the non-conductive sheet layer D2. Further, the patterned metal layers M3 and M4 are formed respectively on the non-conductive sheet layers D1 and D2. Then, the non-conductive sheet layers D3 and D4 are formed respectively on the patterned metal layers M3 and M4. Laser vias V3 are formed in the non-conductive sheet layer D3 and laser vias V4 are formed in the non-conductive sheet layer D4. Further, the patterned metal layers M5 and M6 are formed respectively on the non-conductive sheet layers D3 and D4. Then, the non-conductive sheet layers D5 and D6 are formed respectively on the patterned metal layers M5 and M6. Laser vias V5 are formed in the non-conductive sheet layer D5 and laser vias V6 are formed in the non-conductive sheet layer D6. Finally, the patterned metal layers M7 and M8 are formed respectively on the non-conductive sheet layers D5 and D6. Then, the non-conductive sheet layers D7 and D8 are formed respectively on the patterned metal layers M7 and M8.

It is noted that while the example in FIG. 2 shows four layers of metal layers in each of the build-up portions, the first build-up portion 262 and the second build up portion 264 can include any suitable number of patterned metal layers.

In some examples, when an IC chip is mounted on the surface of the first build-up portion 262, the patterned conductive layers in the first build-up portion 262 are closer to the IC chip than the patterned conductive layers in the second build-up portion 264, thus the patterned conductive layers in the first build-up portion 262 is referred to as near-side conductive layers, and the patterned conductive layers in the second build-up portion 264 are referred to as far-side conductive layers.

The metal traces on the different layers are connected by conductive vias, such as laser vias and/or plated through hole (PTH) vias, in various embodiments. When two metal traces are respectively in two patterned conductive layers are in the first build-up portion 262, such as M1 and M5, the two metal traces can be connected by laser vias V1 and V3) without using any PTH vias. When two metal traces are respectively in two conductive layers in the second build-up portion 264, such as M4 and M6, the two metal traces can be connected by laser vias (e.g., V4) without using any PTH vias. However, when two metal traces are respectively in patterned conductive layers are on opposite sides of the core substrate 263, such as M1 and M2, one or more PTH vias 268 are used to connect the two metal traces.

Figure 3:
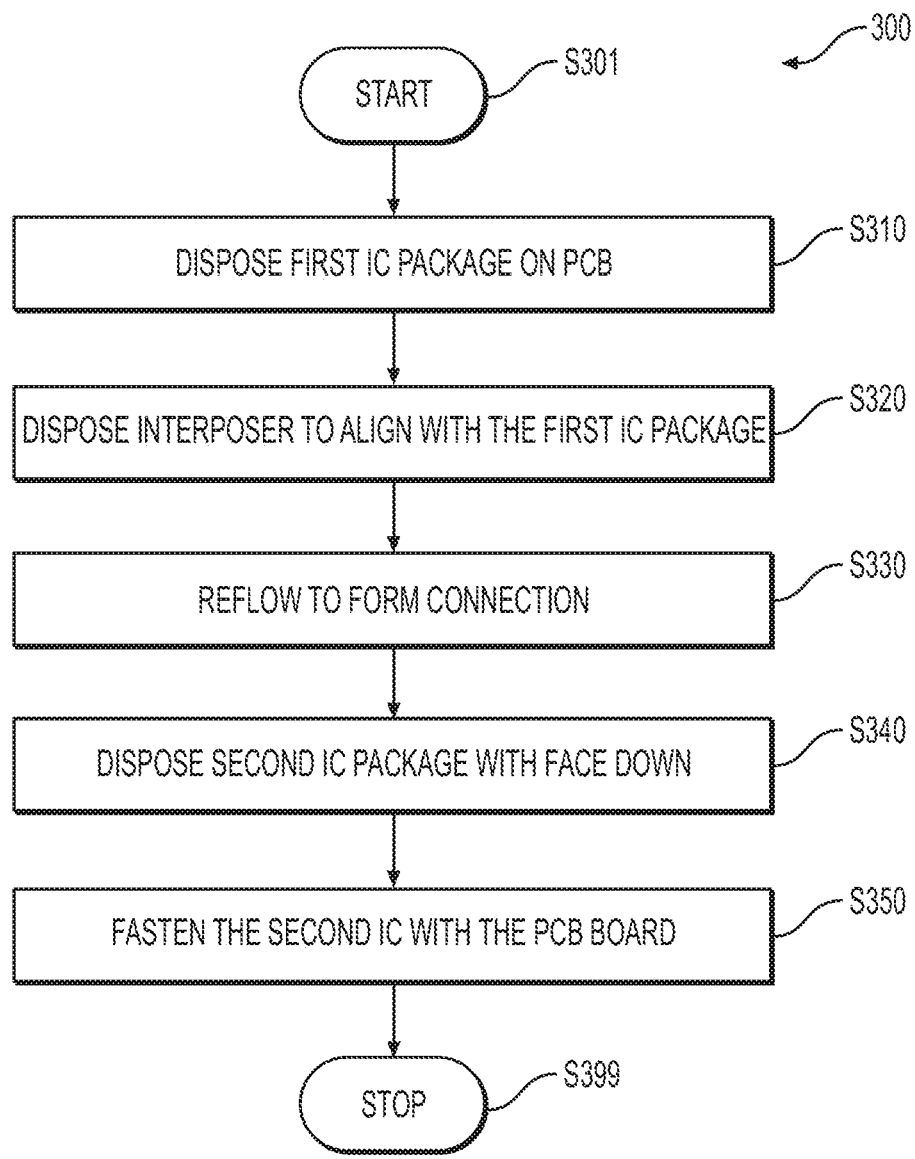
FIG. 3 shows a flow chart outlining a process example 300 for manufacturing the PCB system 100 according to an embodiment of the disclosure.

FIG. 3 shows a flow chart outlining a process example 300 according to an embodiment of the disclosure. In an example, the process 300 is used to form a PCB system, such as the PCB system 100. In the FIG. 3 example, the interposer 130 is a single-compression interposer that includes a first side to form solder connections and a second side to form compression connections. The process starts at S301, and proceeds to S310.

At S310, the first IC package 120 is disposed on the PCB 110. In an example, the first IC package 120 is disposed with the second surface 122 facing the PCB 110, and the second contact structures 123 are aligned with corresponding contact structures on the PCB 110.

At S320, the interposer 130 is disposed and aligned with the first IC package 120. In an example, the first side of the interposer 130 faces the first contact structures 128 and the interposer 130 is disposed and aligned with the first contact structures 128.

At S330, a solder reflow process is performed to form solder connections. In an example, the solder reflow process forms solder connections that electrically connect the second contact structures 123 with the corresponding contact structures on the PCB 110 and forms solder connections that electrically connect the interposer 130 with the first contact structures 128.

At S340, the second IC package 140 is disposed with regard to the first IC package 120. In an example, the second IC package 140 is disposed with the substrate-chip surface 149 facing the substrate-chip surface 129 of the first IC package 120. Further, the second IC package 140 is suitably aligned with the interposer 130 and the first IC package 120. In an example, the holes in the second IC package 140, the first IC package 120 and the PCB 110 for disposing bolts are aligned.

At S350, the second IC package 140 is fastened with the PCB 110 to apply compression force on the interposer 130. For example, the bolts 112 and 114 are fastened to corresponding nuts 113 and 115 to lock the PCB 110, the interposer 130 and the second IC package 140 in place, and to apply compression force to cause the interposer 130 to interconnect the contact structures 148 of the second IC package 140 with the interposer 130. Then, the process proceeds to S399 and terminates.

Figure 4:
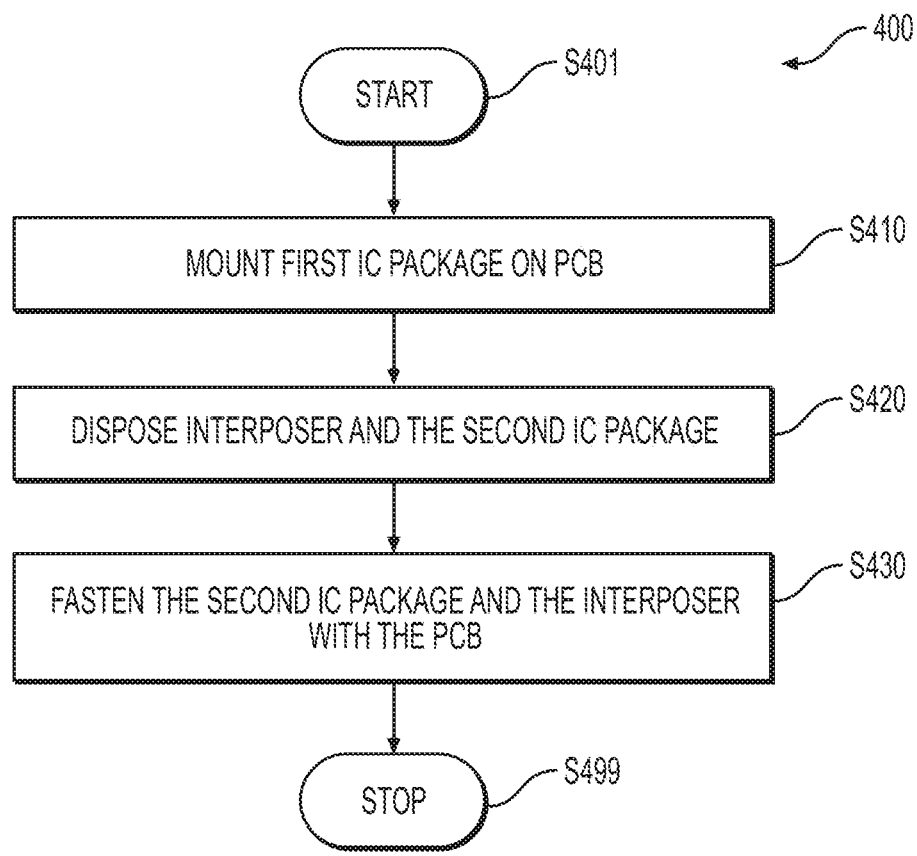
FIG. 4 shows a flow chart outlining another process example 400 for manufacturing the PCB system 400 according to an embodiment of the disclosure.

FIG. 4 shows a flow chart outlining another process example 400 according to an embodiment of the disclosure. In an example, the process 400 is used to form a PCB system, such as the PCB system 100. In the FIG. 4 example, the interposer 130 is a dual-compression interposer that both sides of the interposer 130 are configured to form compression connections. The process starts at S401, and proceeds to S410.

At S410, the first IC package 120 is mounted on the PCB 110. In an example, the first IC package 120 is disposed with the second surface 122 facing the PCB 110, and the second contact structures 123 are aligned with corresponding contact structures on the PCB 110. Then, a solder reflow process is performed to form solder connections. In an example, the solder reflow process forms solder connections that electrically connect the second contact structures 123 with the corresponding contact structures on the PCB 110.

At S420, the interposer 130 and the second IC package 140 are disposed and aligned with the first IC package 120. In an example, the second IC package 140 is disposed with the substrate-chip surface 149 facing the substrate-chip surface 129 of the first IC package 120. Further, the second IC package 140 and the interposer 130 are suitably aligned with the first IC package 120. In an example, the holes in the second IC package 140, the first IC package 120 and the PCB 110 for disposing bolts are aligned.

At S430, the second IC package 140 is fastened with the PCB 110 to apply compression force on the interposer 130. For examples, the bolts 112 and 114 are fastened to corresponding nuts 113 and 115 to lock the PCB 110, the interposer 130 and the second IC package 140 in place, and to apply compression force to cause the interposer 130 to interconnect the contact structures 148 of the second IC package 140, and to interconnect the first contact structures 128 of the first IC package 120. Thus, the first contact structures 128 of the first IC package 120 are electrically coupled with the contact structures 148 of the second IC package 140. Then, the process proceeds to S499 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A package system, comprising:
a first integrated circuit package having (i) a first package substrate, and (ii) a first integrated circuit mounted on a first substrate-chip surface of the first package substrate, wherein the first package substrate includes first near-conductive layers that are closer to the first substrate-chip surface of the first package substrate than first far-conductive layers in the first package substrate;
a second integrated circuit package laterally offset from and overlapping the first integrated circuit package, the second integrated circuit package having (i) a second package substrate, and (ii) a second integrated circuit mounted to a second substrate-chip surface of the second package substrate, wherein the second package substrate includes second near-conductive layers that are closer to the second substrate-chip surface of the second package substrate than second far-conductive layers in the second package substrate;
a first contact structure disposed on the first substrate-chip surface of the first package substrate; and
a second contact structure electrically coupled to the second substrate-chip surface of the second package substrate,
wherein
the first contact structure and the second contact structure are configured to electrically couple the first integrated circuit with the second integrated circuit by electrical connections in (i) the first near-conductive layers, and (ii) the second near-conductive layers.

2. The package system of claim 1, wherein:
the first near-conductive layers and the first far-conductive layers are on opposing sides of a first core substrate of the first package substrate; and
the second near-conductive layers and the second far-conductive layers are on opposing sides of a second core substrate of the second package substrate.

3. The package system of claim 2, wherein:
the first core substrate includes first plated through hole vias that interconnect one of the first near-conductive layers with one of the first far-conductive layers in the first package substrate; and
the second core substrate includes second plated through hole vias that interconnect one of the second near-conductive layers with one of the second far-conductive layers in the second package substrate.

4. The package system of claim 3, wherein:
the first contact structure is electrically coupled to a first input/output structure on the first integrated circuit;
the second contact structure is electrically coupled to a second input/output structure;
the second input/output structure is electrically coupled to the second integrated circuit by the electrical connections in (i) the first near-conductive layers, and (ii) the second near-conductive layers; and
the second input/output structure is electrically coupled to the second integrated circuit by the electrical connections without passing a plated through hole via of (i) the first plated through hole vias, and (ii) the second plated through hole vias.

5. The package system of claim 1, wherein the first integrated circuit package and the second integrated circuit package are disposed with the first substrate-chip surface of the first integrated circuit package facing the second substrate-chip surface.

6. The package system of claim 1, wherein:
the first contact structure is within a first contact structure array that is disposed on the first substrate-chip surface of the first package substrate in a peripheral area adjacent to a first edge of the first integrated circuit; and
the second contact structure is within a second contact structure array that is disposed electrically coupled to the second substrate-chip surface of the second package substrate in a peripheral area adjacent to a second edge of the second integrated circuit.

7. The package system of claim 6, further comprising an interposer disposed between the first contact structure array and the second contact structure array, the interposer configured to electrically couple corresponding contact structures in the first contact structure array and the second contact structure array.

8. The package system of claim 7, wherein the interposer includes compression contacts on at least one side of the interposer configured to electrically couple the interposer to one of the first integrated circuit package and the second integrated circuit package.

9. The package system of claim 8, further comprising a force component configured to apply compression force on a stack of (i) the first IC package, (ii) the interposer and (iii) the second IC package, wherein the compression force applied by the force component on the stack interconnects the first contact structure array with the second contact structure array via the interposer.

10. The package system of claim 8, wherein the interposer includes solder contacts on at least one side of the interposer configured to electrically couple the interposer to (i) the other one of the first integrated circuit package, and (ii) the second integrated circuit package that is not electrically coupled to the interposer by the compression contacts.

11. The package system of claim 10, wherein:
the solder contacts on the at least one side of the interposer are formed during a reflow process additionally forming solder contacts on a surface of the first IC package that opposes the first substrate-chip surface; and
the solder contacts electrically couple one of the first integrated circuit package and the second integrated circuit package to a printed circuit board.

12. A printed circuit board system, comprising:
the package system of claim 1; and
a printed circuit board,
wherein the first integrated circuit package comprises a bottom surface that opposes the first substrate-chip surface and is mounted on the printed circuit board.

13. The printed circuit board system of claim 12, wherein:
the first near-conductive layers and the first far-conductive layers are on opposing sides of a first core substrate of the first package substrate; and
the second near-conductive layers and the second far-conductive layers are on opposing sides of a second core substrate of the second package substrate.

14. The printed circuit board system of claim 13, wherein:
the first core substrate includes first plated through hole vias that interconnect one of the first near-conductive layers with one of the first far-conductive layers in the first package substrate; and
the second core substrate includes second plated through hole vias that interconnect one of the second near-conductive layers with one of the second far-conductive layers in the second package substrate.

15. The printed circuit board system of claim 14, wherein:
the first contact structure is electrically coupled to a first input/output structure on the first integrated circuit;
the second contact structure is electrically coupled to a second I/O structure;
the second I/O structure is electrically coupled to the second integrated circuit by the electrical connections in (i) the first near-conductive layers, and (ii) the second near-conductive layers; and
the second I/O structure is electrically coupled to the second integrated circuit without passing a plated through hole via of (i) the first plated through hole vias, and (ii) the second plated through hole vias.

16. The package system of claim 1, wherein the second near-conductive layers are disposed closer to the second contact structure than a core substrate of the second package substrate.

17. The package system of claim 16, wherein the second contact structure is disposed between the first near-conductive layers and the second near-conductive layers.

18. The package system of claim 1, wherein:
the second integrated circuit is disposed laterally adjacent to the first contact structure;
the first integrated circuit is disposed laterally adjacent to the second contact structure; and
the second contact structure is disposed laterally adjacent to the first contact structure.

19. The package system of claim 1, wherein the first contact structure and the second contact structure are disposed:
between the first near-conductive layers and the second near-conductive layers; and
between the first integrated circuit and the second integrated circuit.

20. The package system of claim 1, wherein the second substrate-chip surface oppose and faces the second substrate-chip surface.

21. A method for interconnecting a first integrated circuit package and a second integrated circuit package, the method comprising:
mounting the first integrated circuit package to a printed circuit board, the first integrated circuit package having (i) a first package substrate, and (ii) a first integrated circuit mounted on a first substrate-chip surface of the first package substrate, wherein the first package substrate includes first near-conductive layers that are closer to the first substrate-chip surface of the first package substrate than first far-conductive layers in the first package substrate;
arranging a second integrated circuit package to be laterally offset from and overlapping the first integrated circuit package, the second integrated circuit package having (i) a second package substrate, and (ii) a second integrated circuit mounted to a second substrate-chip surface of the second package substrate, wherein the second package substrate including second near-conductive layers that are closer to the second substrate-chip surface of the second package substrate than second far-conductive layers in the second package substrate; and
electrically coupling a first contact structure that is formed on the first substrate-chip surface of the first package substrate with a second contact structure that is electrically coupled to the second substrate-chip surface of the second package substrate to electrically couple the first integrated circuit with the second integrated circuit by electrical connections formed in (i) the first near-conductive layers, and (ii) the second near-conductive layers.

22. The method of claim 21, wherein:
electrically coupling the first contact structure with the second contact structure further comprises disposing an interposer between the first integrated circuit package and the second integrated circuit package;
the interposer interconnects a first contact structure array with a second contact structure array;
the first contact structure array is formed on the first substrate-chip surface of the first package substrate; and
the second contact structure array is electrically coupled to the second substrate-chip surface of the second package substrate.

23. The method of claim 22, further comprising reflowing to form solder contacts between the interposer and the first integrated circuit package.

24. The method of claim 22, further comprising applying compression force on the interposer to interconnect the first contact structure array of the first integrated circuit package with the second contact structure array of the second integrated circuit package.

25. The method of claim 24, further comprising fastening a bolt extending between the first integrated circuit package and second integrated circuit package with a nut to apply the compression force to maintain the first integrated circuit package and the second integrated circuit package in electrical contact.

26. A package system, comprising:
a first integrated circuit package comprising
   a first plurality of layers, and
   a first integrated circuit mounted on the first plurality of layers, wherein the first plurality of layers include a first near-conductive layer and a substrate, and wherein the first near-conductive layer is disposed closer to the first integrated circuit than the substrate;
a second integrated circuit package disposed laterally offset from and overlapping the first integrated circuit package, wherein the second integrated circuit package comprises
   a second plurality of layers, and
   a second integrated circuit mounted to the second plurality of layers, wherein the second plurality of layers include a second near-conductive layer and a substrate, wherein the second near-conductive layer is disposed closer to the second integrated circuit than the substrate of the second plurality of layers; and
a contact structure disposed on the first plurality of layers and attached to the second plurality of layers,
wherein
   the second near-conductive layer is disposed closer to the contact structure than the substrate of the second plurality of layers, and
   the contact structure is configured to electrically couple the first integrated circuit with the second integrated circuit via electrical connections in (i) the first near-conductive layer, and (ii) the second near-conductive layer.

* * * * *